United States Patent
Ukita

[11] Patent Number: 5,973,572
[45] Date of Patent: Oct. 26, 1999

[54] PHASE LOCK LOOP CIRCUIT WITH VARIABLE LOOP GAIN

[75] Inventor: Junichi Ukita, Sendai, Japan

[73] Assignee: Advantest Corp., Tokyo, Japan

[21] Appl. No.: 09/041,095

[22] Filed: Mar. 12, 1998

[30] Foreign Application Priority Data

Mar. 19, 1997 [JP] Japan ..................................... 9-066686

[51] Int. Cl.⁶ ........................... H03L 7/085; H03L 7/095; G01R 25/00
[52] U.S. Cl. .................................. 331/25; 331/8; 331/17; 331/DIG. 2; 327/5
[58] Field of Search ............................... 331/4, 8, 15, 17, 331/25, 27, 37, 40–42, DIG. 2; 327/3, 5, 7, 8

[56] References Cited

U.S. PATENT DOCUMENTS

| | | | |
|---|---|---|---|
| 4,596,963 | 6/1986 | Lawton et al. | 331/14 |
| 4,605,909 | 8/1986 | Tsironis | 331/96 |
| 4,704,722 | 11/1987 | Henry | 375/120 |
| 5,038,116 | 8/1991 | Motté | 331/8 |

*Primary Examiner*—David Mis
*Attorney, Agent, or Firm*—Muramatsu & Associates

[57] ABSTRACT

A PLL (phase lock loop) circuit improves pull-in and noise performances by changing a loop gain based on the loop states. The PLL circuit includes a voltage controlled oscillator (VCO) for generating an oscillation signal whose oscillation frequency is controlled by a control voltage provided thereto, a phase comparator for detecting a phase difference between the oscillation signal from the VCO and a reference signal wherein a detection gain of the phase difference is regulated by a bias voltage provided thereto, a low pass filter for receiving an output signal of the phase comparator for removing high frequency components therefrom to produce the control voltage supplied to the VCO, a phase lock loop formed by the VCO, phase comparator and low pass filter, and a phase lock detection circuit for detecting whether the phase lock loop has reached a phase lock state and changing the bias voltage to decrease the detection gain of the phase comparator when the phase lock loop has reached the lock state.

3 Claims, 5 Drawing Sheets

PHASE LOCK LOOP CIRCUIT WITH VARIABLE LOOP GAIN

FIELD OF THE INVENTION

This invention relates to a phase lock loop (PLL) circuit, and more particularly, to an analog type PLL circuit having a phase comparator which is capable of changing a loop gain of the PLL with variable phase comparison sensitivity.

BACKGROUND OF THE INVENTION

An example of PLL in the conventional technology is shown in FIG. 3. The PLL circuit in the example of FIG. 3 includes a phase comparator 10, a low pass filter 20, a voltage controlled oscillator (VCO) 30, forming a negative feedback loop.

A reference signal V1 and an oscillation frequency signal of the VCO 30 are provided to the phase comparator 10 wherein phases of two signals are compared and difference in the phase is detected. The phase difference signal V3 is provided to the low pass filter 20 which determines a loop response characteristics of the PLL. The low pass filter 20 smoothes the phase difference signal to convert the same to an error voltage or a control voltage which is supplied to the VCO 30 to control the oscillation frequency. When the PLL is in a lock-in situation, the phases, i.e., the frequencies of the oscillation signal V2 of the VCO 30 and the reference signal V1 match with one another.

PLL circuits are widely used in communication systems and devices, frequency synthesizers with a frequency divider therein, test instruments, signal generators, frequency modulators and the like.

In the conventional PLL circuit, an example of the phase comparator 10 is an analog multiplier such as a double balanced mixer. When a reference signal V1 and an oscillation signal V2 of the VCO 30 are expressed as equations (1) and (2), respectively, an output V3 of the phase comparator 10, which is an analog multiplier, is expressed by an equation (3) as follows.

$$V1 = 2^{1/2} A \sin \theta(t) \quad (1)$$

$$V2 = 2^{1/2} B \cos \theta'(t) \quad (2)$$

$$V3 = AB \sin(\theta(t) - \theta'(t)) + AB \cos(\theta(t) + \theta'(t)) \quad (3)$$

As shown in the right side of the equation (3), the output signal V3 of the phase comparator 10 includes a multiplied component showing a phase difference of the two signals V1 and V2 and a multiplied component showing a phase sum of the two signals V1 and V2. The output signal V3 is provided to the low pass filter 20 where the component having the phase sum of the two signals V1 and V2 is removed. Thus, the component (error voltage) showing the phase difference between the signals V1 and V2 is feed-backed to the VCO 30 to control the phase of the oscillation signal of the VCO 30.

Because the PLL circuit is a negative feedback loop, the PLL circuit functions to minimize the phase difference between the oscillation signal V2 and the reference signal V1. When the PLL circuit reaches the lock-in situation, the phases of the two signals match with one another, i.e., the oscillation frequency of the VCO 30 output signal V1 becomes the same as the frequency of the reference signal V2.

Parameters of the low pass filter 20 and a gain of the PLL circuit determine a response characteristics of the PLL circuit. In the operational process of the PLL circuit, there are two steps to reach the steady (phase lock) state of the PLL circuit. The first step is a frequency pulling process (pull-in) wherein the oscillation frequency of the VCO is driven close to the frequency of the reference signal. The second step is a phase synchronization (lock-in) process wherein the phases of the VCO output signal and the reference signal are completely synchronized.

In describing the operational ranges of a phase clock loop, such terms as a lock range, a pull-in range, and a lock-in range are generally used. The lock range means a maximum frequency difference between the VCO free running oscillation frequency and the reference signal frequency for which the PLL can maintain the lock-in state. The pull-in range (also called a capture range) means a frequency difference between the VCO free running oscillation frequency and the reference signal frequency for which the PLL can acquire the lock state. The lock-in range means a frequency difference between the VCO oscillation frequency and the reference signal frequency for which the PLL immediately goes into the lock state. The relationship among these ranges is that expressed as:

$$\text{lock range} > \text{pull-in range} > \text{lock-in range} \quad (4)$$

The dynamic response characteristics of the phase lock loop is determined mainly by a transient response of the low pass filter 20. The parameters of the low pass filter 20 are selected so that the transient response shows, for example, a first order delay curve.

In case where the frequency difference between the oscillation frequency of the VCO 30 and the reference signal frequency is too large, frequency components in the difference signal from the phase comparator 10 may not pass through the low pass filter 20. This means that the frequency difference is outside of the pull-in range of the PLL, and thus, the lock state will not be achieved by the PLL circuit.

Once the PLL circuit establishes the lock state, the response speed of the PLL for following the frequency change in the reference signal, for example, is solely determined by the low pass filter 20. Since the low pass filter 20 has the delay response curve as noted above, when the PLL circuit is instantaneously out of the lock state by noise or the like, the lock state is immediately resumed. In other words, the low pass filter 20 performs as a memory for recording the control voltage to be supplied to the VCO 30 for a short period of time.

Generally, an SN (signal to noise) ratio, a pull-in range, a lock-in range, and a response speed of a phase lock loop are largely dependent upon a loop gain of the feed back loop of the PLL. When the loop gain increases, the pull-in range and the lock-in range increase as well while the time required for reaching the lock-in state decreases (loop response speed is high). However, the higher the loop gain, the lower it becomes the SN ratio, i.e., the noise increases. Conversely, when the loop gain decreases, the pull-in range and the lock-in range will decrease accordingly while the time required for reaching the lock-in state will increase (loop response speed is low). However, by the decrease of the loop gain, the SN ratio will improve, i.e., the noise decreases.

As in the foregoing, in the PLL circuit using the conventional phase comparator having the double balanced mixer or the like, the loop gain affects the PLL characteristics both advantageously and disadvantageously. Therefore, it is not possible to achieve all of the desired characteristics of a phase lock loop, i.e., a wide pull-in range and lock-in range, a high response speed, and a high SN ratio at the same time.

SUMMARY OF THE INVENTION

Therefore, it is an object of the present invention to provide a phase lock loop (PLL) circuit with a variable loop gain which has a wide pull-in and lock-in range, a high response speed, and a high SN ratio at the same time.

It is another object of the present invention to provide a PLL circuit which is capable of reaching a phase lock state at high speed even when a frequency difference between an oscillation frequency signal to be phase locked and a reference frequency signal is large.

It is a further object of the present invention to provide a PLL circuit which is capable of increasing the speed and frequency range for reaching the phase lock state by using a high loop gain and reducing noise in the lock state of the PLL circuit by using a low loop gain.

The PLL circuit of the present invention includes a voltage controlled oscillator for generating an oscillation signal whose oscillation frequency is controlled by a control voltage provided thereto, a phase comparator for detecting a phase difference between the oscillation signal from the voltage controlled oscillator and a reference signal wherein a detection gain of the phase difference is variable by a bias voltage provided thereto, a low pass filter for receiving an output signal of the phase comparator and removing high frequency components from the output signal to produce the control voltage supplied to the voltage controlled oscillator, a phase lock loop formed by the voltage controlled oscillator, phase comparator and low pass filter, and a phase lock detection circuit for detecting whether the phase lock loop has reached a phase lock state and changing the bias voltage to decrease the detection gain of the phase comparator when the phase lock loop has reached the lock state.

As described in the foregoing, according to the present invention, a phase lock loop (PLL) circuit can achieve a wide pull-in and lock-in range, a high response speed, and a high SN ratio at the same time. The PLL circuit is capable of reaching a phase lock state at high speed even when a frequency difference between an oscillation frequency signal to be phase locked and a reference frequency signal is large. The PLL circuit of the present invention is capable of increasing the speed and frequency range for reaching the phase lock state by using a high loop gain and reducing noise after reaching the lock state by using a low loop gain.

DETAILED DESCRIPTION OF THE INVENTION

Figure 1:
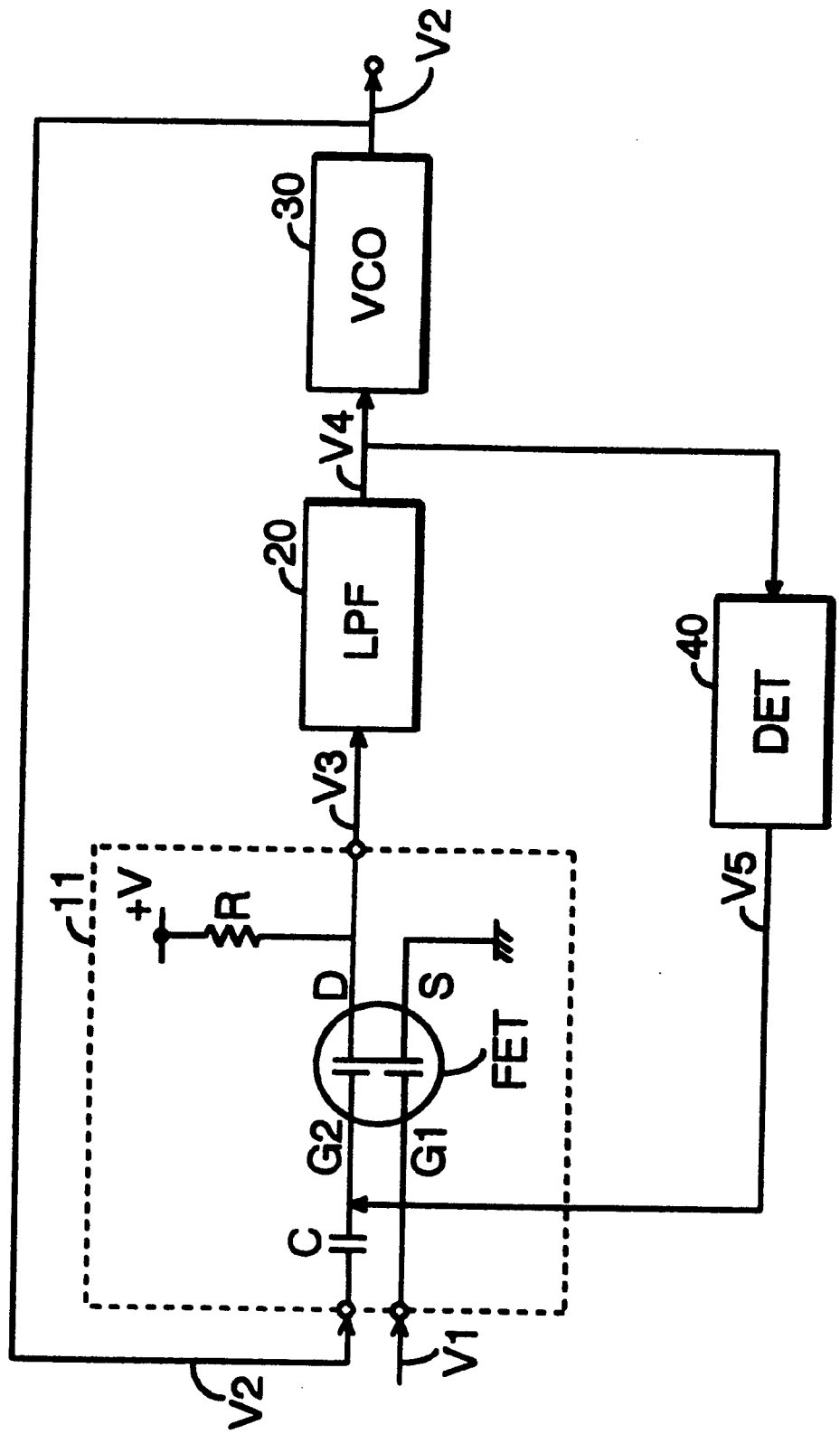
FIG. 1 is a block diagram showing a structure of a first embodiment of a phase lock loop (PLL) circuit of the present invention.

The first embodiment of the present invention is explained with reference to FIGS. 1 and 2. In the example of FIG. 1, the PLL circuit includes a phase comparator 11, a low pass filter 20, a voltage controlled oscillator (VCO) 30, and a phase lock detection circuit 40.

The phase comparator 11 in the PLL circuit is formed, for example, of a dual gate field effect transistor (FET) having two input terminals, i.e., two gates. One input terminal G1 receives a reference signal V1 while another input terminal G2 receives an oscillation signal feed-backed from the VCO 30 through a DC cut capacitor C.

The dual gate FET functions as a multiplier because of a feature wherein forward admittance |Yfs| changes with the change of the voltage applied to the gate G2. The forward admittance |Yfs| is a rate of small change in a drain current $\Delta Id$ in response to a small change $\Delta V_{G2S}$ between the gate G2 and the source of the FET as expressed by an equation (5).

$$|Yfs|=\Delta Id/\Delta V_{G2S} \qquad (5)$$

Figure 2:
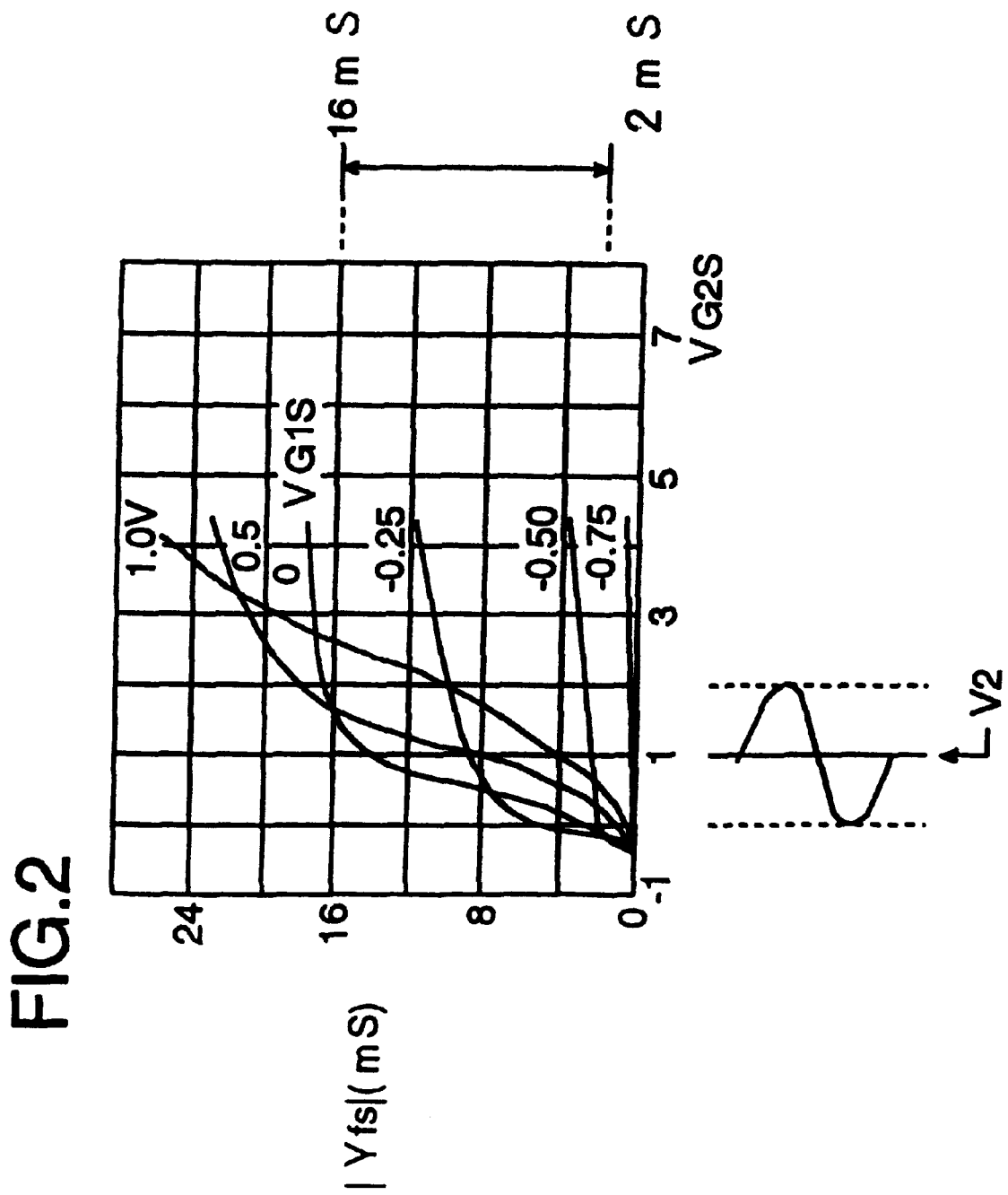
FIG. 2 is a graph showing operational characteristics of a dual gate field effect transistor (FET) to be used as a phase comparator of the present invention.
Figure 3:
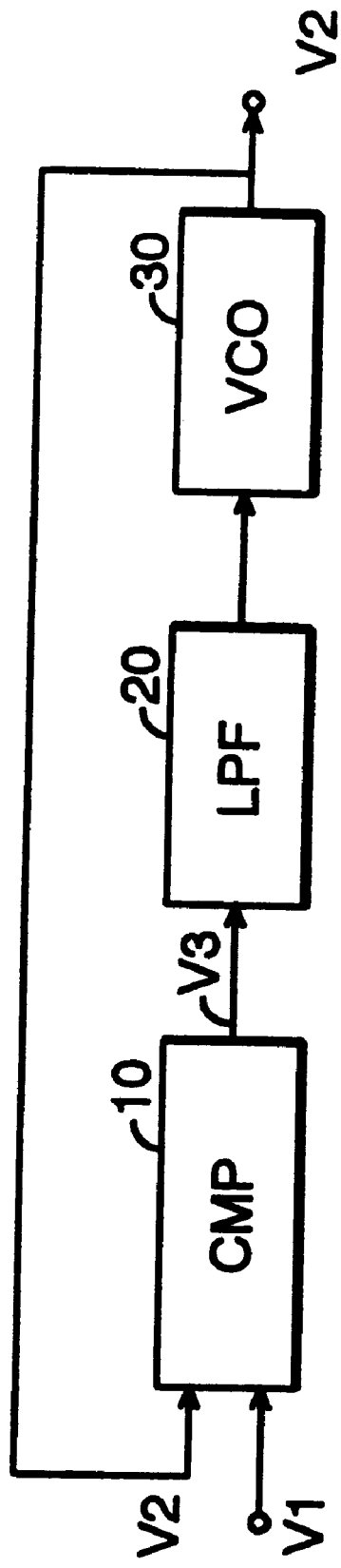
FIG. 3 is a block diagram showing a PLL circuit in the conventional technology.

For example, in FIG. 2, when applying a signal V2 having a peak to peak voltage of 2 $V_{p-p}$ to the gate G2 of the FET where a bias voltage $V_{G2S}$ between the gate G2 and the source is 1 V, because of the peak to peak voltage of the signal V2, the forward admittance |Yfs| will change between 2 mS and 16 ms when the bias voltage $V_{G1S}$ between the gate G1 and the source is 0 V, where S designates siemence. The output voltage of the dual gate FET is G times the amplitude of the signal V2 where G is a gain factor of the dual gate FET. The gain G of the dual gate FET is variable because the forward admittance |Yfs| will change by the change of the bias voltage $V_{G2S}$.

As noted above, the dual gate FET functions as a phase comparator because it performs a multiplier function. Moreover, since the gain factor is variable in response to the bias voltage $V_{G2S}$, the dual gate FET functions as a phase comparator wherein phase comparision (detection) sensitivity can be controlled by the bias voltage between the gate and the source. The above noted features of the dual gate FET apply in the same manner as in operations where a voltage $V_{G1S}$ between the gate G1 and the source is regulated.

Thus, the phase comparator 11 made of the dual gate FET multiplies a reference signal V1 and an oscillation signal V2 of the VCO 30 and produces a signal V3 having a frequency component indicating a sum and difference between the reference signal V1 and the VCO oscillation signal V2. The frequency component showing the difference between the reference signal V1 and the VCO output signal passes through the low pass filter 20 to feedback to the VCO 30.

The phase lock detection circuit 40 monitors the output of the low pass filter 20 to determine whether the PLL circuit is in the process of reaching the lock state or the PLL circuit has reached the lock state. The phase lock detection circuit 40 provides a bias voltage V5 to the dual gate FET. The bias voltage V5 has different voltage levels depending on whether the PLL is in the process of phase lock or reached the phase lock. In case where the PLL has not reached the lock state between the reference signal V1 and the VCO output signal V2, the phase lock detection circuit 40 provides a higher bias voltage between the gate G2 and the source of the FET, resulting in a larger loop gain of the PLL circuit. However, in case where the PLL reaches the lock state, the phase lock detection circuit 40 provides a lower bias voltage, resulting in a smaller loop gain than that used before reaching the lock state.

For example, during the transient process of acquiring the lock state, the bias voltage of 0.5 V is provided to the dual gate FET to increase the loop gain by using the high forward admittance of the FET. After reaching the lock state, the bias voltage is decreased to, for example, 0 V so that the loop gain of the PLL is decreased because of the low forward admittance of the FET. Because the loop gain is large during the transient process, a wider pull-in range and lock-in range as well as a high speed response of the PLL circuit are achieved. After establishing the lock state, since the loop gain is decreased, the PLL circuit can achieve an improved SN ratio, i.e., low noise.

The feature of the present invention is expressed by mathematical equations regarding the relationship among a reference signal V1, an output signal V2 of the VCO, and a resultant output signal V3 of the phase comparator 11 as in the following:

$$V1 = 2^{1/2} A \sin \theta(t) \tag{6}$$

$$V2 = 2^{1/2} B \cos \theta'(t) \tag{7}$$

$$V3 = V1 \times V2 = 2^{1/2} A \sin \theta(t) \times 2^{1/2} B \cos \theta'(t) \times G = ABG \sin (\theta(t) - \theta'(t)) + ABG \cos (\theta(t) + \theta'(t)) \tag{8}$$

where G designates the gain of the phase comparator 11.

As expressed by the equation (8), each term in the right side of the equations (8) is multiplied by the gain G of the phase comparator 11. Since the high frequency component is removed by the low pass filter 20, an error voltage V4 applied to the VCO 30 is:

$$V4 = ABG \sin (\theta(t) - \theta'(t)) \tag{9}$$

Since the error voltage V4 includes the gain G of the phase comparator 11, an appropriate loop gain will be established in the PLL circuit by adjusting the gain G of the phase comparator 11.

In a PLL circuit, there is a relationship as expressed by equation (10) between an angular frequency $\Delta\omega$ of the reference signal V1, and a closed loop gain ABGK:

$$|\Delta\omega| \leq ABGK \tag{10}$$

where K is a closed loop transmission constant. The equation (10) means that the PLL circuit goes into the lock state when the angular frequency $\Delta\omega$ is smaller than the closed loop gain ABGK. Thus, during the transient process for the PLL circuit to acquire the lock state, a wide band and high speed transition will be available by increasing the loop gain ABGK of the PLL circuit.

Further in a PLL circuit, a noise bandwidth BW is expressed by equation (11) as follows:

$$BW = ABGK/4 \tag{11}$$

The equation (11) means that the noise bandwidth is proportional to the loop gain of the PLL circuit. Thus, after reaching the lock state in the PLL circuit, by decreasing the loop gain of the PLL circuit, the noise bandwidth BW decreases accordingly, resulting in the high the SN ratio in the output signal of the VCO 30.

Figure 5:
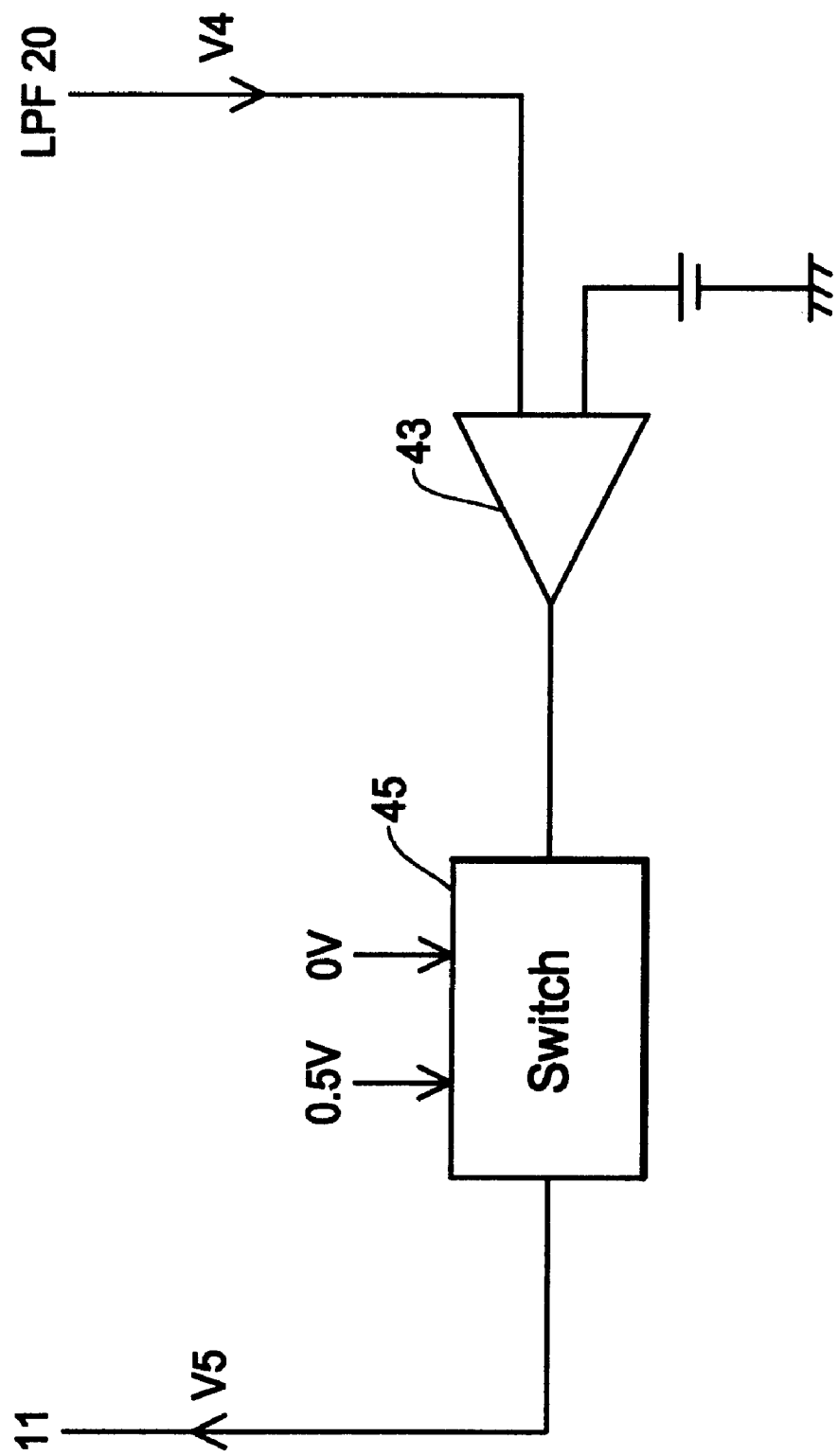
FIG. 5 is a block diagram showing a structural example of the phase lock detection circuit incorporated in the present invention.

As noted above, the loop gain is controlled by the bias voltage V5 from the phase lock detection circuit 40. An example of the phase lock detection circuit 40 is shown in FIG. 5. One input of a differential amplifier 43 is connected to the output of the low pass filter 20 to monitor the voltage V4, and another input thereof is provided with a reference voltage which is, for example, the same voltage of the voltage V4 when the PLL is not in the lock state. An output of the differential amplifier 43 is connected to a switch 45 which switches between the different values of the bias voltage V5. When the PLL circuit is out of the lock state, two input voltages to the differential amplifier 43 are the same so that the switch 45 provides the bias voltage V5 of 0.5 V. When the PLL circuit is phase locked, the voltage V4 changes which is amplified by the differential amplifier 43 to drive the switch 45 to provide the bias voltage 0 V to the dual gate FET. In this manner, the bias voltage is regulated depending on the state of the PLL circuit.

In the example of FIG. 1, the reference signal V1 is provided to the first gate G1 of the dual gate FET while the output signal V2 of the VCO 30 is provided to the second gate G2 through the DC cut capacitor C. The phase lock detection circuit 40 monitors the output signal of the low pass filter 20 and detects whether the PLL circuit has reached the lock state. The phase lock detection circuit 40 changes the bias voltage V5 to the gate G2 when the PLL is locked to decrease the forward admittance of the FET, resulting in the decrease of the loop gain of the PLL.

Figure 4:
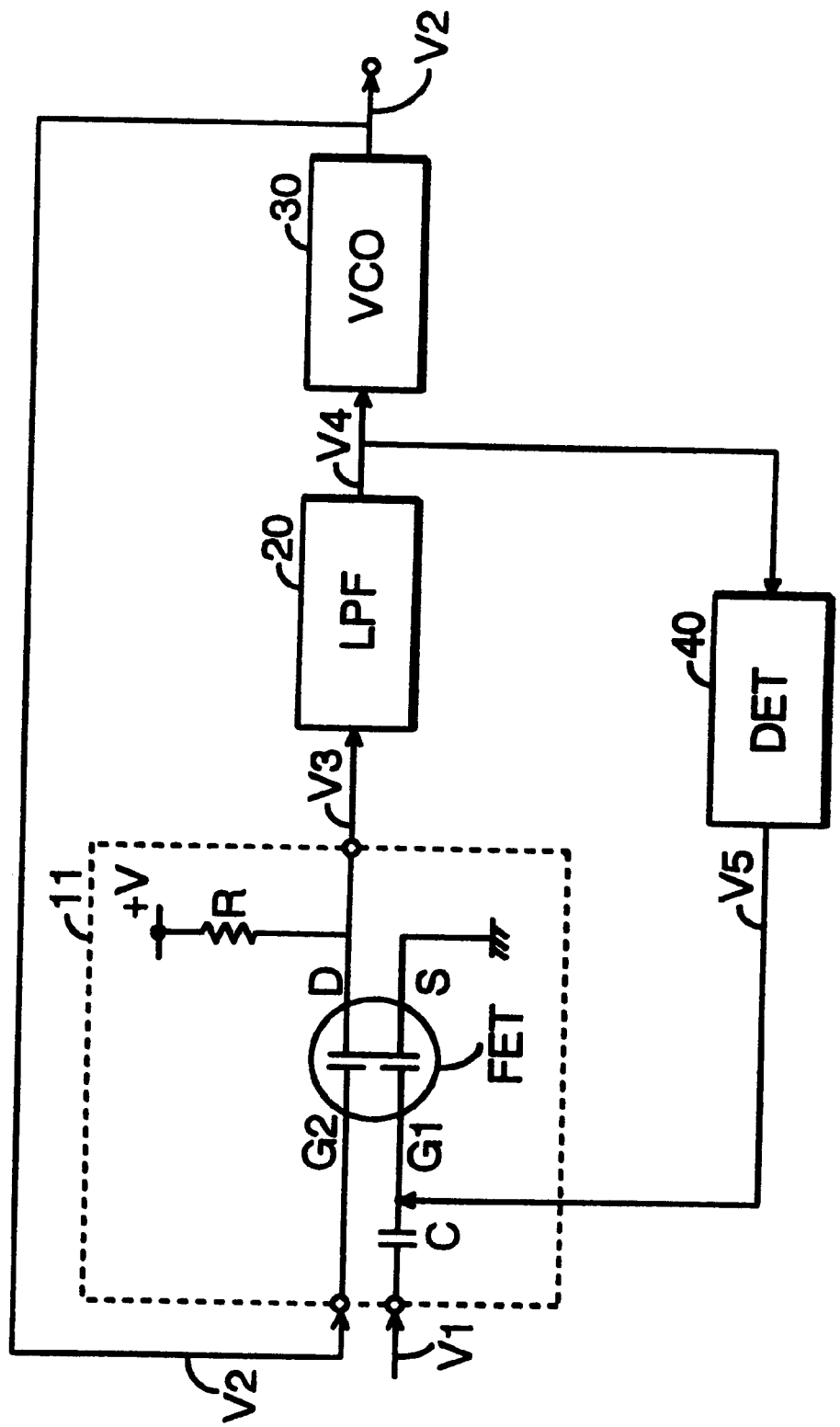
FIG. 4 is a block diagram showing a structure of a second embodiment of a PLL circuit of the present invention.

Another example of structure is possible as shown in FIG. 4 wherein the reference signal V1 is provided to the first gate G1 of the dual gate FET through the DC cut capacitor C while the output signal V2 of the VCO 30 is directly provided to the second gate G2. The phase lock detection circuit 40 monitors the output signal of the low pass filter 20 and detects whether the PLL circuit has reached the lock state. The phase lock detection circuit 40 changes the bias voltage V5 to the gate G1 when the PLL is locked to decrease the forward admittance of the FET, resulting in the decrease of the loop gain of the PLL.

Although the embodiments of the present invention utilize the dual gate FET as the phase comparator, other components or circuit arrangements are also feasible within the scope of the invention so long as a detection gain of the phase comparator is controllable.

As described in the foregoing, according to the present invention, the PLL circuit achieves a wide pull-in and lock-in range, a high response speed, and a high SN ratio at the same time. The PLL circuit is capable of reaching a phase lock state at high speed even when a frequency difference between an oscillation frequency signal to be phase locked and a reference frequency signal is large. The PLL circuit of the present invention is capable of increasing the speed and frequency range for reaching the phase lock state by using a high loop gain and reducing noise in the lock state by using a low loop gain.

What is claimed is:

1. A phase lock loop circuit, comprising:

a voltage controlled oscillator for generating an oscillation signal whose oscillation frequency is controlled by a control voltage provided thereto;

a phase comparator for detecting a phase difference between the oscillation signal from said voltage controlled oscillator and a reference signal, a detection gain for detecting said phase difference being variable by a bias voltage provided thereto, said phase comparator being a dual gate field effect transistor (FET) having two input gates wherein a forward admittance thereof being variable by said bias voltage supplied to either one of said gates;

a low sass filter for receiving an output signal of said phase comparator showing said phase difference and removing high frequency components from the output signal to produce said control voltage supplied to said voltage controlled oscillator;

a phase lock loop formed by said voltage controlled oscillator, phase comparator and low pass filter to minimize said phase difference by controlling said oscillation frequency of said voltage controlled oscillator; and a phase lock detection circuit for detecting whether the phase lock loop has reached a phase lock state and changing said bias voltage so that said detection gain of said phase comparator decreases when the phase lock loop has reached said lock state.

2. A phase lock loop circuit as defined in claim 1, wherein said phase lock detection circuit includes a differential amplifier to produce a switching signal based on a voltage change at the output of said low pass filter, and a switch for changing said bias voltage to said phase comparator based on said switching signal from said differential amplifier.

3. A phase lock loop circuit, comprising:

voltage controlled oscillation means for generating an oscillation signal whose oscillation frequency is controlled by a control voltage provided thereto;

phase comparison means for detecting a phase difference between the oscillation signal from said oscillation means and a reference signal, a detection gain for detecting said phase difference being variable by a bias voltage provided thereto, said phase comparison means being formed of a dual gate field effect transistor (FET) having two input gates wherein a forward admittance thereof being variable by said bias voltage supplied to either one of said input gates;

filter means for receiving an output signal of said phase comparison means showing said phase difference and removing high frequency components from the output signal to produce said control voltage supplied to said oscillation means;

a phase lock loop formed by said oscillation means, phase comparison means and filter means to minimize said phase difference by controlling said oscillation frequency of said oscillation means; and a phase lock detection means for detecting whether the phase lock loop has reached a phase lock state and changing said bias voltage so that said detection gain of said phase comparison means decreases when the phase lock loop has reached said lock state.

* * * * *